US005796152A

United States Patent [19]

Carr et al.

[11] Patent Number: 5,796,152

[45] Date of Patent: Aug. 18, 1998

[54] CANTILEVERED MICROSTRUCTURE

[75] Inventors: William N. Carr, Montclair; Xi-qing Sun, Kearny, both of N.J.

[73] Assignee: Roxburgh Ltd., Douglas, Isle of Man

[21] Appl. No.: 787,281

[22] Filed: Jan. 24, 1997

[51] Int. Cl.[6] .......... H01L 29/82

[52] U.S. Cl. .......... 257/415; 257/418; 257/419; 73/504.15

[58] Field of Search .......... 257/415–419; 73/504.15

[56] References Cited

U.S. PATENT DOCUMENTS

| | | | |
|---|---|---|---|
| 5,058,856 | 10/1991 | Gordon et al. | 251/11 |
| 5,536,963 | 7/1996 | Polla | 257/417 |
| 5,635,750 | 6/1997 | Schlaak et al. | 257/414 |
| 5,659,195 | 8/1997 | Kaiser et al. | 257/415 |

FOREIGN PATENT DOCUMENTS

| | | | |
|---|---|---|---|
| 516418A | 12/1992 | European Pat. Off. | 257/419 |

OTHER PUBLICATIONS

IEEE Proceedings—Micro Electro Mechanical Systems, Feb. 1990, pp. 128–131, M. Parameswaran et al., "CMOS Electrothermal Microactuators".

IEEE Proceedings—Micro Electro Mechanical Systems, Jan. 1995, pp. 310–315, Terunobu Akiyama et al., "A Quantitative Analysis of Scratch Drive Actuator Using Buckling Motion".

IEEE Transactions on Electron Devices, vol. 35, No. 6, Jun. 1988, pp. 758–763, Werner Riethmüller et al., "Thermally Excited Silicon Microactuators".

The Eighth International Conference on Solid–State Sensors and Actuators, and Eurosensors IX, Jun. 1996, pp. 416–419, G. Lin et al., "Design, Fabrication, and Testing of a C–Shape Actuator".

Symposium on Micromechanical Systems, DSC–vol. 40, Nov. 1992, pp. 13–23, E. Obermeier et al., "Electrostatically Activated Micro–Shutter In (110) Silicon".

Technical Digest—Solid–State Sensor and Actuator Workshop, Jun. 1996, pp. 191–195, Yongli Huang et al., "Piezoelectrically Actuated Microcantilever for Actuated Mirror Array Application".

Technical Digest—Solid–State Sensor and Actuator Workshop, Jun. 1996, pp. 31–35, Sun et al., "Lateral In–Plane Displacement Microactuators with Combined Thermal and Electrostatic Drive".

Late–News Poster Session Supplemental Digest—Solid––State Sensor and Actuator Workshop, Jun. 1996, pp. 1–2, R. K. Gupta et al., "Pull–In Dynamics of Electrostatically––Actuated Beams".

*Primary Examiner*—Mahshid D. Saadat
*Assistant Examiner*—Allan R. Wilson
*Attorney, Agent, or Firm*—Ohlandt, Greeley, Ruggiero & Perle

[57] ABSTRACT

A cantilever microstructure includes a cantilever arm with a proximal end connected to a substrate and a freely movable distal end. The cantilever arm comprises first and second sections and includes a continuous layer which exhibits a first thermal co-efficient of expansion (TCE). In one embodiment, an electrical contact is positioned at the distal end of the cantilever arm. A first layer is positioned on a surface of the continuous layer and along the first section thereof. The first layer exhibits a second TCE which is different from the first TCE of the continuous layer. A second layer is positioned on a surface of the continuous layer and along the second section thereof. The second layer exhibits a third TCE which is different from the first TCE of the continuous layer. Electrical control circuitry selectively applies signals to the first and second layers to cause a heating thereof and a flexure of the cantilever arm so as to bring the distal end thereof into contact with a conductive substrate.

15 Claims, 5 Drawing Sheets

CANTILEVERED MICROSTRUCTURE

FIELD OF THE INVENTION

This invention relates to microstructures that are constructed utilizing semiconductor fabrication processes and, more particularly, to a cantilevered microstructure produced in accordance with such semiconductor processes.

BACKGROUND OF THE INVENTION

Silicon "micromachining" has been developed as a means for accurately fabricating small structures. Such processing involves the selective etching of a silicon substrate and the deposition thereon of thin film layers of semiconductor materials. Various sacrificial layers are employed to enable the fabrication of relatively complex interactive structures.

Silicon micromachining has been applied to the fabrication of micromachines that include rotary and linear bearings. Such bearings have spawned further development of electrically-driven motors which exhibit a planar geometry and lateral dimensions on the order of 100 microns or so. In addition to micromotors, various microactuators have also been constructed utilizing micromachining concepts.

FIGS. 1*a* and 1*b* illustrate a prior art cantilever device wherein a polysilicon layer 10 is bonded to a layer 12 of different composition. Both layers are bonded, at one extremity, to a substrate 14. The thermal coefficients of expansion of polysilicon layer 10 and layer 12 are chosen as to be sufficiently different that, without an applied potential to create a heating action, the structure exhibits an arcuate form as shown in FIG. 1*a*. When, as shown in FIG. 1*b*, a voltage Vt is applied between layers 10 and 12 and current flow causes a heating of the layers, unequal expansion results in a clockwise rotation of the arm until contact is made with substrate contact region 16.

The action of the cantilever structure of FIGS. 1*a* and 1*b* is much the same as a well known bi-metal thermal actuator widely used in thermostats. Further details of such structures can be found in "Thermally Excited Silicon Microactuators", Riethmuller et al., IEEE Transactions on Electron Devices, Volume 35, No. 6, Jun. 1988, pages 758–763, and in "Design, Fabrication and Testing of a C-Shape Actuator", Lin et al., Proceedings Eighth International Conference on Solid State Sensors and Actuators, Stockholm, Sweden, Jun. 25–29, 1995, pages 418–420.

A further example of a thermal actuator comprising a sandwich of polysilicon and gold can be found described in "CMOS Electrothermal Microactuators", Parameswaran et al., Proceedings IEEE Microelectro-Mechanical Systems, 11–14 Feb. 1990, pages 131.

As shown in FIGS. 2*a* and 2*b*, cantilever arms have also been constructed using piezoelectric films which exhibit a large $d_{31}$ characteristic. Such a piezoelectric film 20 has been sandwiched between a pair of electrodes 22 and 24 and coupled in a cantilever fashion to a contact 26. Application of a voltage Vpz between electrodes 22 and 24 causes a flexure of piezoelectric film 20 (see FIG. 2*b*), resulting in a counter-clockwise rotation of the cantilever arm and a disconnection of an electrical pathway between contacts 26 and 28.

In lieu of constructing a cantilever arm having an unattached free end, other prior art has employed a "tied-down" cantilever structure to provide a buckling action upon actuation by either a piezoelectric force or by a thermally actuated, differential expansion action. For instance, see "A Quantitative Analysis of Scratch Drive Actuator Buckling Motion", Akiyama et al., Proceedings IEEE Micro-Electromechanical Systems, Jan. 29–Feb. 2, 1995, pages 310–315. A further version of such a buckling system is described in "Lateral In-plane Displacement Microactuators with Combined Thermal and Electrostatic Drive", Sun et al., Solid-State Sensor and Actuator Workshop, Hilton Head, Jun. 3–6, 1996, pages 31–35.

Piezoelectrically actuated cantilever microdevices have been proposed for a variety of applications. Huang et al. in "Piezoelectrically Actuated Micro cantilever for Actuated Mirror Array Application", Solid-State Sensor and Actuator Workshop, Hilton head Island, S.C., Jun. 3–6, pages 191–195, have suggested the use of a piezoelectrically actuated cantilever structure for controlling the orientation of micro-mirrors. Such cantilever structures enable the redirection of an incident light beam to create an optical switching effect.

The application of electrostatic forces to provide both pull-down and repulsive forces in microactuators is known. Such a structure is shown in FIG. 3, wherein a cantilever arm 29 comprises a polysilicon layer 30 affixed to an insulating layer 32 and spans substrate contacts 34 and 36. When a voltage Vs is applied between contact 36 and across layers 30 and 32, an electrostatic force is created which provides a hold-down action between free end 37 of cantilever arm 29 and substrate contact 36.

Various electrostatically actuated devices can be found described in "Pull-in Dynamics of Electrostatically Actuated Beams", Gupta et al., Poster Session Supplemental Digest, Solid-State Sensor and Actuator Workshop, Hiltonhead Island, S.C., Jun. 3–6, 1996, pages 1, 2.

Electrostatic actuation has also been employed to control the action of a microshutter, wherein a moving electrode of aluminum, chromium, gold or doped polysilicon and a fixed counter electrode is employed. The deflection of the moving electrode is controlled by electrostatic forces. The moving electrode rotates about an axis and employs a torsional-cantilever action. (See "Electrostatically Activated Micro-Shutter in (110) Silicon", DSC-Volume 40, Micromechanical Systems ASME, 1992, pages 13–22.

The prior art devices described above, while utilizing both thermal and piezoelectrically-controlled actuation, exhibit limited ranges of motion of the free ends of the cantilever arms. Such limitations restrict the application of the devices, notwithstanding their inherently low cost.

Accordingly, it is an object of this invention to provide an improved microactuator that exhibits extended ranges of movement of the actuating member.

It is another object of this invention to provide an improved microactuator which employs thermal actuation to accomplish movement of the actuating member.

It is another object of this invention to provide an improved microactuator that employs piezoelectric control to accomplish movement of the actuating member.

It is yet another object of this invention to provide a micromachined actuator which can be utilized for optical shuttering, control of a movable platform, and other applications.

SUMMARY OF THE INVENTION

A cantilever microstructure includes a cantilever arm with a proximal end connected to a substrate and a freely movable distal end. The cantilever arm comprises first and second sections and includes a continuous layer which exhibits a first thermal co-efficient of expansion (TCE). In one embodiment, an electrical contact is positioned at the distal end of the cantilever arm. A first layer is positioned on a surface of the continuous layer and along the first section thereof. The first layer exhibits a second TCE which is different from the first TCE of the continuous layer. A second layer is positioned on a surface of the continuous layer and along the second section thereof. The second layer exhibits a third TCE which is different from the first TCE of the continuous layer. Electrical control circuitry selectively applies signals to the first and second layers to cause a heating thereof and a flexure of the cantilever arm so as to bring the distal end thereof into contact with a conductive substrate.

DETAILED DESCRIPTION OF THE INVENTION

Figure 1A:
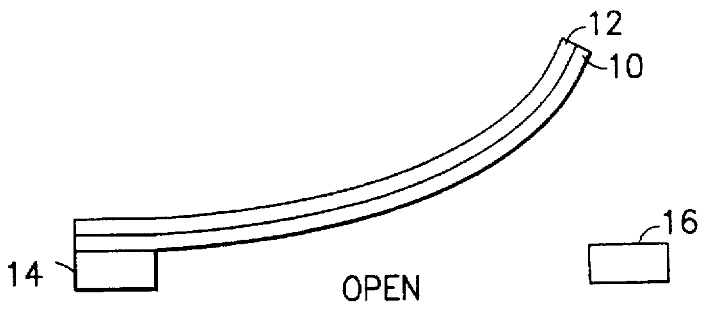
FIG.1a PRIOR ART
FIG. 1*a* is a schematic view of a prior art, thermally actuated cantilever microstructure in an open position.
Figure 1B:
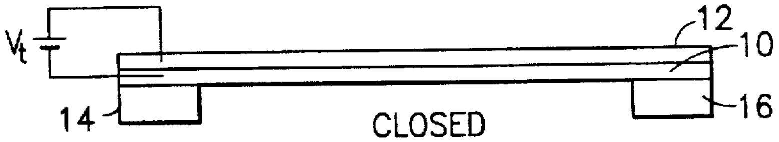
FIG.1b PRIOR ART
FIG. 1*b* is a schematic view of the thermally actuated cantilever microstructure of FIG. 1*a* in the closed position.
Figure 2A:
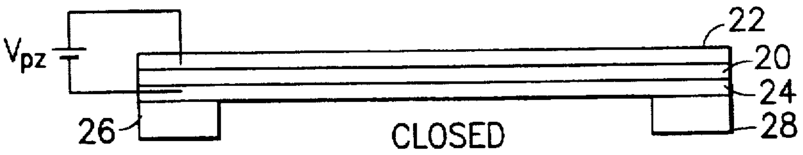
FIG.2a PRIOR ART
FIG. 2*a* is a schematic view of a prior art, piezoelectrically actuated cantilever microstructure in the closed position.
Figure 2B:
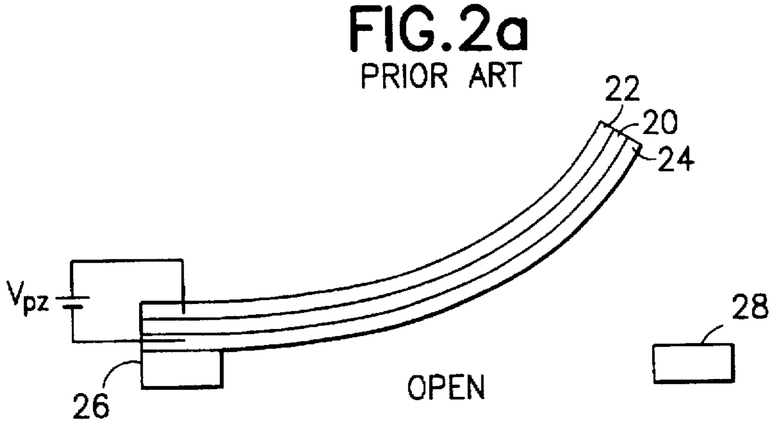
FIG.2b PRIOR ART
FIG. 2*b* is a schematic view of the prior art cantilever microstructure of FIG. 2*a* in the open position.
Figure 3:
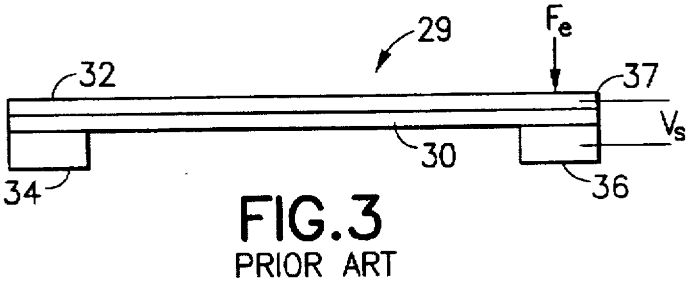
FIG.3 PRIOR ART
FIG. 3 illustrates a prior art microcantilever which utilizes an electrostatic potential to provide a holddown force.
Figure 4:
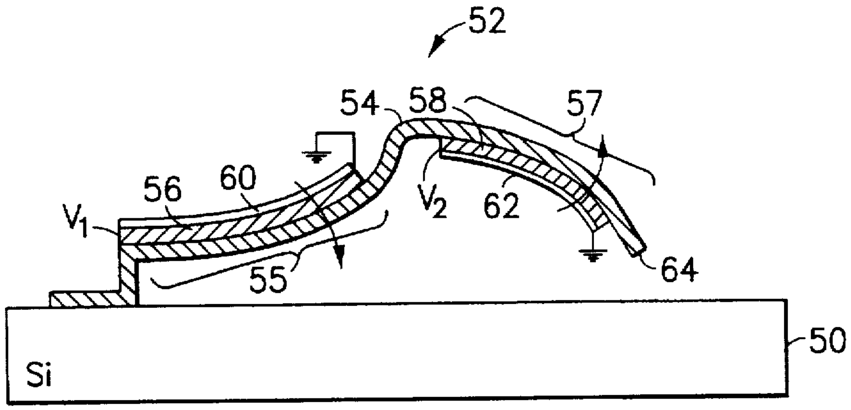
FIG. 4 is a schematic illustration of a microcantilever structure incorporating the invention hereof.

FIG. 4 is a schematic of a multi-segment microcantilever incorporating the invention hereof. A silicon substrate 50 supports a multi-segment microcantilever 52 that is electrothermally actuated. A continuous film 54 forms the central structure of microcantilever 52 and exhibits a first thermal coefficient of expansion (TCE). Microcantilever 52 is segmented into two sections 55 and 57. In section 55, a film 56, exhibiting a dissimilar TCE to that of continuous film 54 is bonded to continuous film 54. Section 57 of microcantilever 52 includes a film 58 which is bonded to continuous film 54, but on an opposite surface thereof from film 56. Film 58 may be comprised of the same material as film 56, or may be a different film and can exhibit a still-different TCE from that of films 56 and 54.

A resistive layer 60 is positioned on film 56 and a resistive layer 62 is positioned on film 58. The unheated position of sections 55 and 57 can be controlled to be either clockwise or counterclockwise, using known process technologies, i.e., annealing. Application of voltage V1 to resistive film 60 causes a heating of underlying films 56 and 54 and an expansion of both thereof. Their unequal TCE's cause, for example, a clockwise rotation of section 55 of microcantilever 52. In a similar vein, an application of a voltage V2 to resistive film 62 causes a thermal heating of films 58 and 54, an expansion of both thereof and, for example, a counter-clockwise rotation of section 57 of microcantilever 52. By selective application of voltages V1 and V2, a multiplicity of movements of microcantilever 52 can be achieved which enable a both physical latching action and an electrical contact to be accomplished at the distal end 64 of microcantilever 52.

The microcantilever of FIG. 4 is preferably produced using known micromachining/silicon processing procedures. The structure of FIG. 4 can be produced using either a low temperature or high temperature process (i.e. 300° C. or 850° C. maximum temperatures, respectively). The low temperature process is compatible with CMOS VLSI processes. Under such conditions, aluminum is preferably utilized as a sacrificial layer; continuous film 54 is P-doped amorphous silicon and films 56 and 58 are low temperature thermal oxides such as silicon dioxide. Substrate 50 is a monocrystalline silicon substrate and supports continuous silicon film 54 in a cantilever fashion.

If it is desired to configure the microstructure of FIG. 4 for actuation by application of heat, utilizing the high temperature process (i.e. 850° C. maximum temperature), then a low temperature thermal oxide is employed as the sacrificial layer(s), films 56 and 58 are comprised silicon nitride, and film 54 comprises a P-doped polysilicon material. Resistive heater layers 60 and 62 may also be comprised of P-doped polysilicon. Films 56 and 58 may be semiconductive films to enable elimination of resistive films 60 and 62. A further option is to utilize a high resistivity polysilicon film layer 54 (initially undoped) that is processed to include a diffused or implanted heater pattern.

Figure 5:
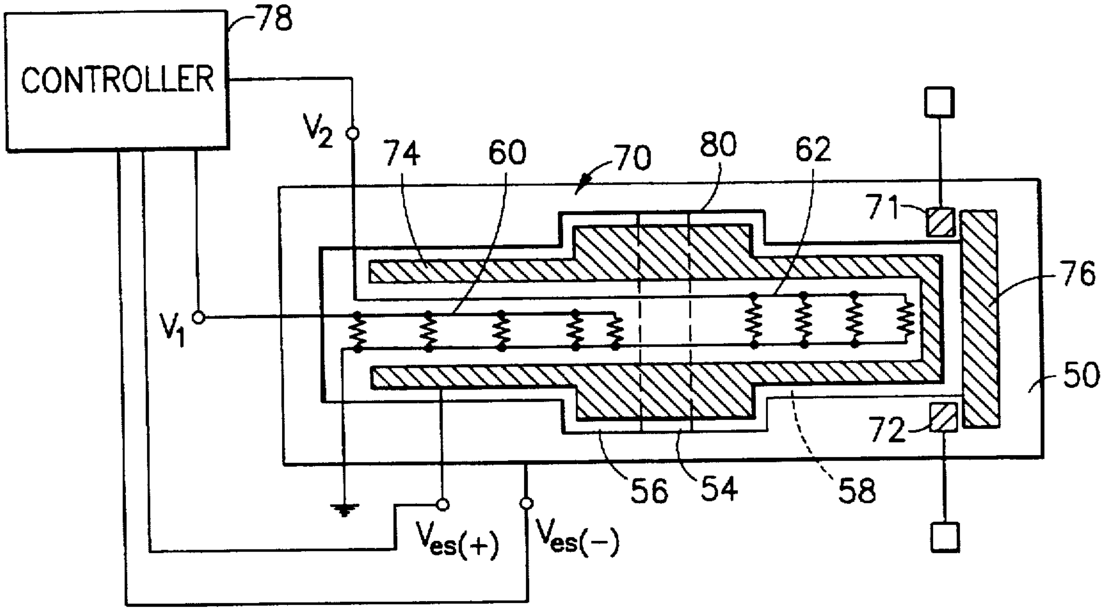
FIG. 5 is a plan view of a microcantilever structure employing the invention.

In FIG. 5, a microcantilever structure 70 is illustrated which performs an electrical switching function between a pair of contacts 71 and 72. Microcantilever 70 accomplishes not only physical latching and electrical contact actions but also manifests an electrostatic hold-down capability. Note that the side view of FIG. 6 only illustrates some of the layers utilized in microcantilever 70 of FIG. 5, to avoid over-complication of the view.

Figure 6:
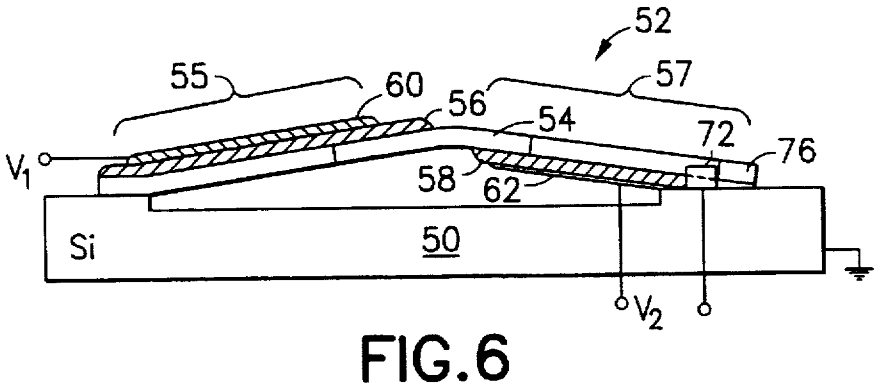
FIG. 6 is a schematic side view of the microcantilever structure of FIG. 5.

In FIGS. 5 and 6, portions of microcantilever 70 which perform the same functions as schematic microcantilever 52 shown in FIG. 4 are numbered the same.

Microcantilever 70 comprises a central film 54 (e.g. silicon), with dielectric films 56 and 58 positioned on opposed surfaces thereof. Resistive layers 60 and 62 (see FIG. 6) are shown schematically in FIG. 5. A conductive layer 74 is continuous about the periphery of the upper surface of microcantilever 70 and is utilized for electrostatic hold-down purposes. The mid-portion of microcantilever 70 exhibits a pair of extended regions 80 to provide additional stability and position control during flexure of microcantilever 70.

At the distal end of microcantilever 70 is positioned a conductive bar 76 which, when in contact with contacts 71 and 72, creates a short circuit therebetween. Contacts 71 and 72 may be insulated from silicon substrate 50 by intervening insulation regions or may be in contact with structures integrated into substrate 50.

It is preferred that the interface surfaces between contacts 71, 72 and conductive bar 76 exhibit a roughened condition so as to assure good electrical and physical contact therebetween. Such roughened surfaces assure that, when engaged, conductive bar 76 remains engaged with contacts 71 and 72 until proper voltages are applied to cause a disengagement thereof. The roughened surfaces may exhibit roughness structures ranging from atomic dimensions to mask-defined dimensions of a few micrometers.

A controller 78 (which may, for instance, be a microprocessor) provides output voltages which control (i) the application of heater currents to resistive layers 60 and 62 and (ii) an electrostatic hold-down voltage between conductor 74 and substrate 50. (Note that electrostatic hold-down conductor 74 is not shown in FIGS. 5 or 6).

Figure 7A:
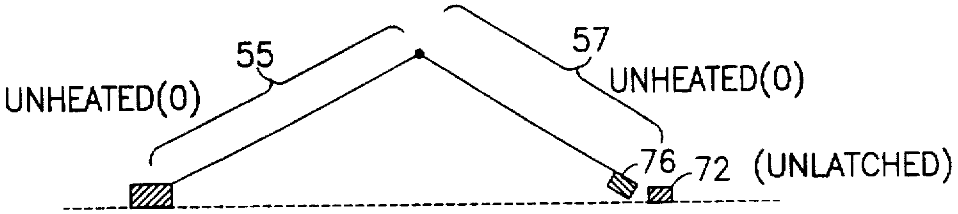
FIGS. 7*a*–7*e* illustrate a sequence of schematic views useful in understanding the operation of the microcantilever structure of FIGS. 5 and 6.
Figure 7B:
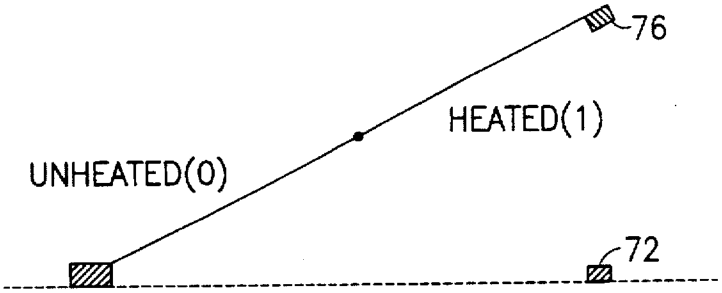

FIGS. 7*a*–7*e* schematically illustrate the operation of microcantilever 70, in transitioning from an unlatched state to a latched state, wherein conductor bar 76 creates a short circuit between contacts 71 and 72. Initially, in FIG. 7*a*, controller 78 has turned off energizing currents to resistive layers 60 and 62. Under these conditions, sections 55 and 57 of microcantilever 70 are unheated and conductive bar 76 remains out of contact with contacts 71 and 72. To create a latching action, controller 78 initially applies voltage V2 to resistive layer 62, causing a heating thereof and an expansion of films 54 and 58. Because of the differing TCE's between films 54 and 58, a counter-clockwise rotation occurs of section 57 of microcantilever 70 (FIG. 7*b*).

Figure 7C:
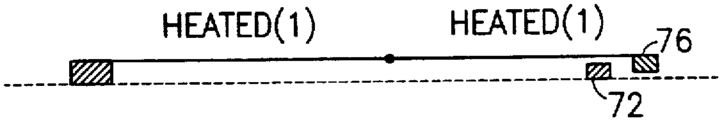
Figure 7D:
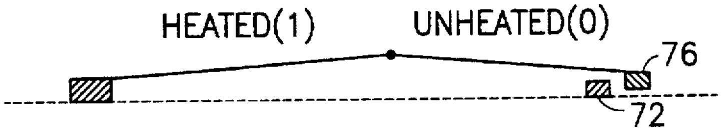

Next, controller 78 applies voltage V1 to resistive layer 60 and continues application of voltage V2 to resistive layer 62. The result is as shown in FIG. 7*c* wherein section 55 of microcantilever 70 is caused to rotate in a clockwise direction, causing a downward movement of conductor bar 76. Thereafter (FIG. 7*d*), controller 78 removes voltage V2 from resistive layer 62, while continuing application of voltage V1 to resistive layer 60. As layers 54 and 58 cool, the differential contraction therebetween causes a clockwise rotation of section 57 of microcantilever 70 until the roughened posterior edge of conductor bar 76 contacts the roughened frontal edge of contact 72.

Figure 7E:
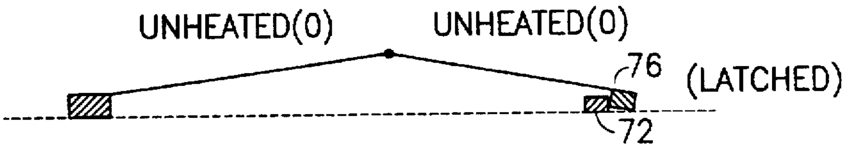

Thereafter (FIG. 7*e*), power is removed from the section 55 of microcantilever 70 and the resulting clockwise movement thereof causes conductor bar 76 to be drawn against contacts 71 and 72 into a "latched" condition. To unlatch microcantilever 70 from contacts 71 and 72, the procedure is reversed, as shown in FIGS. 7*e*–7*a*.

From the above description, it can be seen that the individually controllable movements of sections 55 and 57 of microcantilever 70 enable a secure latching action to be achieved and assures excellent electrical connection between contact 71, 72 by conductor bar 76. The multiple motions achievable from control of microcantilever 70 can also be utilized for a variety of other applications.

Figure 8:
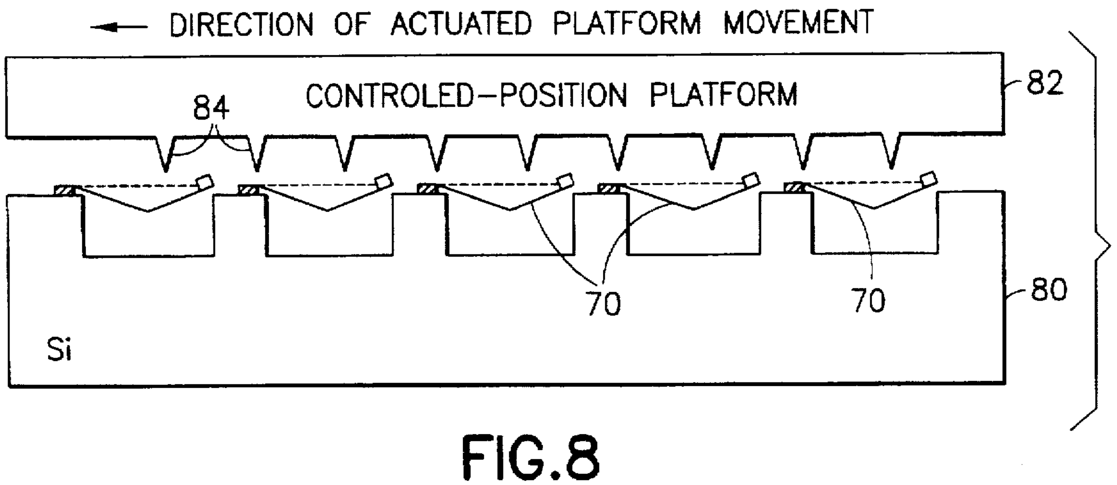
FIG. 8 illustrates application of a microcantilever structure, such as shown in FIG. 4, to the movement of a platform structure.

In FIG. 8, the use of microcantilever 70 to perform a physical movement of a platform is illustrated. A plurality of microcantilevers 70 are fabricated on silicon substrate 80 in a reverse orientation to that shown in FIGS. 4–6. Immediately above silicon substrate 80 is a platform 82 which is movable in a lateral direction. In one embodiment, jutting down from the underside of platform 82 are a plurality of projections 84 which are adapted to interact with microcantilevers 70, when each thereof is actuated. By applying appropriate heater voltages to the sections of each of microcantilevers 70, they are collectively caused to rotate in a counterclockwise direction and to engage protrusions 84. Such engagement causes a movement to the left of platform 82 by an amount that is dependent upon the amount of movement of each of microcantilevers 70. Platform 82 may be spring biased to the right, which spring bias is overcome by the action of microcantilevers 70. In other applications, such as for the positioning of silicon wafer disks, protrusions 84 are not needed and friction between the cantilevers and the wafer permits positioning thereof.

The action of the structure of FIG. 8 enables precise 3-D control of a "microplatform". In accordance with the level of energy applied, respectively, to the sections of each of microcantilevers 70, the vertical height of platform 82 can be adjusted and maintained. In addition, both x and y lateral movements of platform 82 are implemented as described above.

Figure 9A:
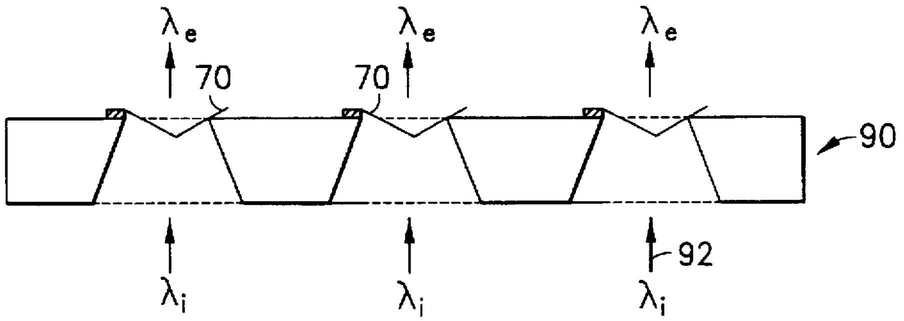
FIGS. 9*a* and 9*b* illustrate application of a microcantilever incorporating the invention hereof to an optical shutter.
Figure 9B:
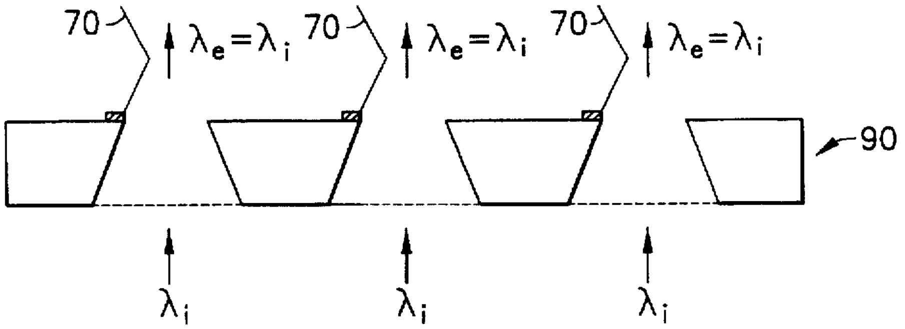

FIGS. 9*a* and 9*b* illustrate the use of microcantilevers 70 as shutters in an optical gating structure 90. By appropriate control of each of microcantilevers 70, light incident along direction 92 can either be passed through optical gating structure 90 or be blocked thereby. The multi-section arrangement of each of microcantilevers 70 enables the movement thereof out of the respective light pathways, thereby enabling a maximum amount of light to pass therethrough. While each of microcantilevers 70 is shown in FIG. 9*b* as being simultaneously actuated, those skilled in the art will understand that individual microcantilevers 70 can be selectively controlled so as to either open a light pathway or not, in dependence upon the voltages supplied via a connected controller. Thus, one or more apertures can be caused to pass light and the remaining apertures can be in a shut state, in dependence upon a particularly desired control scheme.

Figure 10:
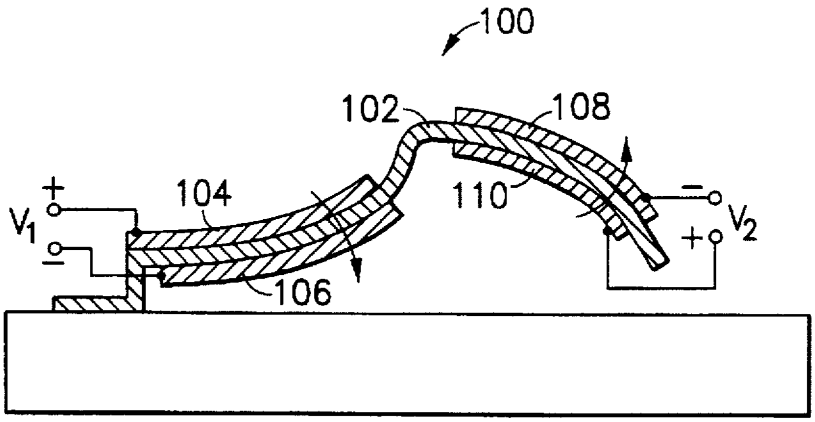
FIG. 10 is a schematic view of a piezoelectrically-controlled cantilever microstructure incorporating the invention hereof.

Each of the embodiments described above has employed electrothermal actuation of a microcantilever to achieve a movement thereof about an anchor point. In FIG. 10, a microcantilever 100 employs piezoelectric/electrostrictive layers to achieve a wide range of motions that are similar to those achieved by the electrothermally actuated microcantilevers described above. A piezoelectric/electrostrictive film 102 includes a first section and a second section, the first section being sandwiched by a pair of electrodes 104, 106 and the second section by a pair of electrodes 108 and 110. Electrodes 104 and 106 are connected to a source of control voltage V1, and electrodes 108 and 110 are connected to a source of control voltage V2. By reversing the respective potentials applied to electrodes 104, 106 and 108, 110, opposite directions of movement can be achieved. Additional electrode films can be added to the structure of FIG. 10 to add electrostatic pulldown action. Further, thermally heated films can be added to the structure of FIG. 10 to provide movement control.

Other than the fact that actuator 100 is operated by piezoelectric/electrostrictive actions, its movements can be controlled in substantially the same manner as the electrothermally actuated microactuator described above.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A cantilever microstructure comprising:

a substrate;

a cantilever arm having a length dimension extending between a proximal end connected to said substrate and a free distal end, said cantilever arm including at least a first section and a second section, respectively disposed at different locations along said length dimension, said cantilever arm comprised of a material exhibiting a first thermal coefficient of expansion (TCE);

contact means positioned near said distal end;

first layer means positioned on a surface of said cantilever arm in said first section, said first layer means exhibiting a second TCE which is different from the first TCE;

second layer means positioned on a surface of said cantilever arm in said second section, said second layer means exhibiting a third TCE which is different from the first TCE;

control means for selectively applying signals to said first layer means and/or said second layer means to cause a flexure of said cantilever arm so as to bring said distal end into or out of contact with said contact means.

2. The cantilever microstructure as recited in claim 1, wherein said first layer means comprises a first dielectric layer and a first resistive layer, and said second layer means comprises a second dielectric layer and a second resistive layer, said control means applying said signals to said first resistive layer and second resistive layer to cause a heating of said first resistive layer and second resistive layer and said cantilever arm, whereby differential expansion/contraction causes movement of said first section and second section of said cantilever arm.

3. The cantilever microstructure as recited in claim 2, wherein said first dielectric layer and second dielectric layer exhibit identical TCE's.

4. The cantilever microstructure as recited in claim 2, wherein said first dielectric layer is positioned on one surface of said cantilever arm and said second dielectric layer is positioned on a surface of said cantilever arm that is opposed to said one surface.

5. The cantilever microstructure as recited in claim 1, wherein said contact means is positioned on said substrate and comprises at least a pair of electrical contacts and said distal end comprises a conductor which provides a circuit path between said contact means when in contact therewith.

6. The cantilever microstructure as recited in claim 5, wherein said pair of electrical contacts and said conductor manifest irregular surfaces at points of contact therebetween to assure frictional contact therebetween.

7. The cantilever microstructure as recited in claim 5, wherein said pair of electrical contacts and said conductor manifest irregular surfaces at points of contact therebetween to assure a minimum electrical contact resistance therebetween.

8. The cantilever microstructure as recited in claim 2, wherein said first dielectric layer and said second dielectric layer are comprised of silicon nitride and said cantilever arm is comprised of polysilicon.

9. The cantilever microstructure as recited in claim 2, wherein said first dielectric layer and said second dielectric layer are comprised of an oxide of silicon and said cantilever arm is comprised of amorphous silicon.

10. The cantilever microstructure as recited in claim 1, further comprising:

conductive means positioned on and insulated from said cantilever arm at least in a region of said free distal end; and means for applying a potential between said conductive means and said contact means which induces an electrostatic hold-down force on said distal end when said distal end is in contact with said contact means.

11. An actuator comprising:

a movable structure;

a substrate positioned adjacent said movable structure;

plural cantilever actuators mounted on said substrate, each comprising:

a cantilever arm having a length dimension extending between a proximal end connected to said substrate and a distal end, said cantilever arm comprising at least a first section and a second section, respectively disposed at different locations along said length dimension, said cantilever arm comprised of a material exhibiting a first thermal coefficient of expansion (TCE);

first layer means positioned on a surface of said cantilever arm and along said first section, said first layer means exhibiting a second TCE which is different from the first TCE;

second layer means positioned on a surface of said cantilever arm and along said second section, said second layer means exhibiting a third TCE which is different from the first TCE; and control means for selectively applying signals to said first layer means and/or said second layer means to cause a flexure of said cantilever arm so as to bring said distal end into contact with said movable structure to cause movement thereof.

12. An optical shutter comprising:

an apertured structure including plural apertures;

plural cantilever shutters mounted on said apertured structure, each shutter comprising:

a cantilever shutter having a length dimension including a proximal end connected to said apertured structure and an extending portion for closing an adjacent aperture, said extending portion comprising a first section and a second section positioned at different locations along said length dimension and exhibiting a first thermal coefficient of expansion (TCE);

first layer means positioned on a surface of said cantilever shutter and along said first section, said first layer means exhibiting a second TCE which is different from the first TCE;

second layer means positioned on a surface of said cantilever shutter and along said second section, said second layer means exhibiting a third TCE which is different from the first TCE; and control means for selectively applying signals to said first layer means and/or said second layer means to cause a flexure of said cantilever shutter so as to move said extending portion to optically block said adjacent aperture or unblock said adjacent aperture.

13. A cantilever microstructure comprising:

a substrate;

a cantilever arm having a length dimension extending between a proximal end connected to said substrate and a distal end, said arm comprising a first section and a second section positioned at different locations along said length dimension and comprised of a material exhibiting a piezoelectric/electrostrictive characteristic;

contact means positioned near said distal end;

first electrode means positioned about said cantilever arm and along said first section, for causing, upon energization, movement of said first section;

second electrode means positioned about said cantilever arm and along said second section, for causing, upon energization, movement of said second section; and control means for selectively applying signals to said first electrode means and/or said second electrode means to cause a flexure of said cantilever arm so as to bring said distal end into or out of contact with said contact means.

14. The cantilever microstructure as recited in claim 13, further comprising:

thermally actuated means positioned on said cantilever arm which, when energized, act to cause further movement of said cantilever arm.

15. The cantilever microstructure as recited in claim 13, further comprising:

conductive means positioned on and insulated from said cantilever arm at least in a region of said distal end: and means for applying a potential between said conductive means and said contact means which induces an electrostatic hold-down force on said distal end when said distal end is in contact with said contact means.

* * * * *